US010879885B2

(12) United States Patent
Lenz et al.

(10) Patent No.: US 10,879,885 B2
(45) Date of Patent: Dec. 29, 2020

(54) DIODE CIRCUIT

(71) Applicant: Infineon Technologies AG, Neubiberg (DE)

(72) Inventors: Michael Lenz, Zorneding (DE); Damiano Gadler, Klagenfurt (AT); Ioannis Pachnis, Villach (AT); Albino Pidutti, Villach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/799,141

(22) Filed: Feb. 24, 2020

(65) Prior Publication Data

US 2020/0274528 A1    Aug. 27, 2020

(30) Foreign Application Priority Data

Feb. 25, 2019   (DE) .................. 10 2019 104 691

(51) Int. Cl.
*H03K 17/042*   (2006.01)
*H02M 3/158*    (2006.01)
(Continued)

(52) U.S. Cl.
CPC ... *H03K 17/04206* (2013.01); *H01L 27/0629* (2013.01); *H02M 3/1582* (2013.01); *H03K 17/165* (2013.01)

(58) Field of Classification Search
CPC ........... H03K 17/04206; H03K 17/165; H03K 17/042; H03K 5/12; H03K 17/04;
(Continued)

(56) References Cited

U.S. PATENT DOCUMENTS 9,742,289 B2 *  8/2017  Hayakawa ........ H02M 3/33507
10,033,297 B2   6/2018  Pidutti et al.
(Continued)

FOREIGN PATENT DOCUMENTS

DE     102016114820 A1    2/2017

OTHER PUBLICATIONS

P. Sachdev, "0V to 18V Ideal Diode Controller Saves Walls and Space over Schottky", Linear Technology Magazine, Sep. 2008, 5 pages.

*Primary Examiner* — Jung Kim
(74) *Attorney, Agent, or Firm* — Slater Matsil, LLP

(57) ABSTRACT

An integrated circuit includes a transistor having a control electrode and a load current path to activate and to deactivate a load current path between a first terminal and a second terminal. A diode is in parallel with the load current path of the transistor. The integrated circuit includes a detector circuit to generate a control signal depending on a voltage between the first terminal and the second terminal. The integrated circuit includes a driver circuit having a main branch and a first feedforward branch. The main branch includes circuit components to generate a control voltage for the control electrode of the transistor in accordance with the control signal, and the feedforward branch comprises circuit components to generate a charging current or, alternatively, a discharging current as a reaction to a slope of the control signal, the current charging or discharging, respectively, the control electrode of the transistor.

10 Claims, 6 Drawing Sheets

(Switch-on and Switch-off)

(51) Int. Cl.
*H01L 27/06* (2006.01)
*H03K 17/16* (2006.01)

(58) Field of Classification Search
CPC ............. H03K 17/04123; H03K 19/01; H03K 17/04106; H03K 17/0412; H02M 3/1582; H01L 27/0629
See application file for complete search history.

(56) References Cited

U.S. PATENT DOCUMENTS

| | | |
|---|---|---|
| 2009/0302927 A1 | 12/2009 | Doffin |
| 2011/0304360 A1 | 12/2011 | Nakamura et al. |
| 2018/0166999 A1 | 6/2018 | Pidutti et al. |

\* cited by examiner

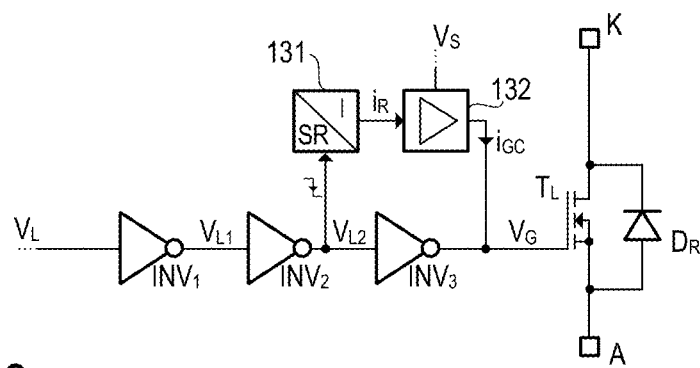
Fig. 6  (Switch-on)
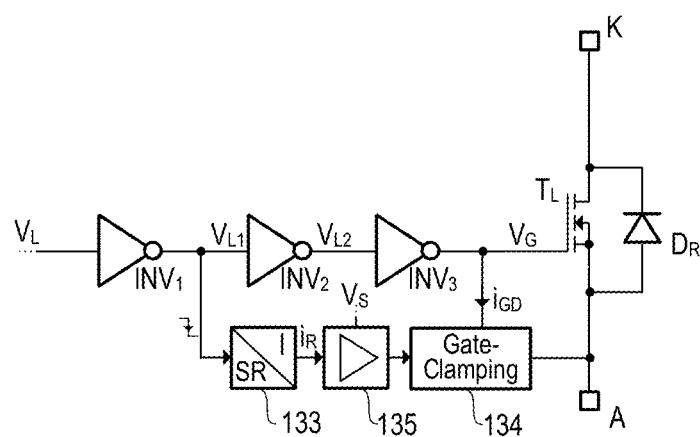
Fig. 7  (Switch-off)
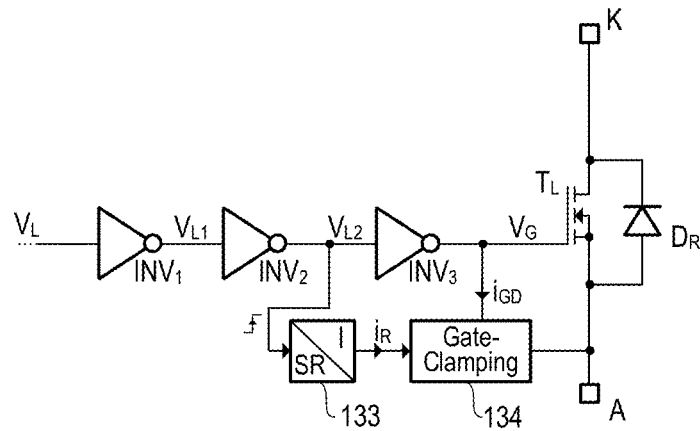
Fig. 8  (Switch-off)

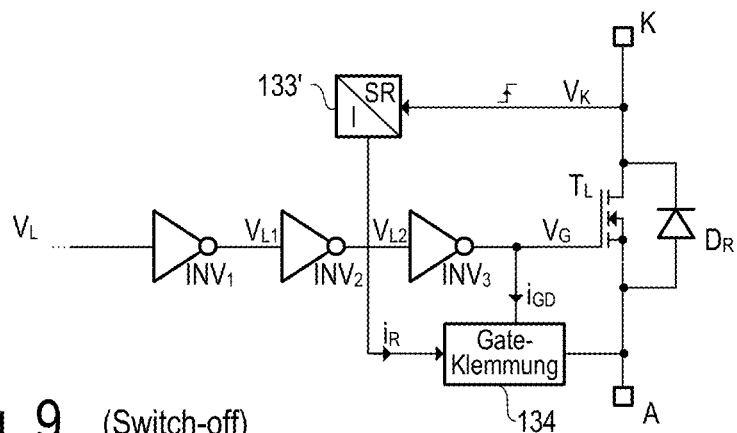
Fig. 9 (Switch-off)
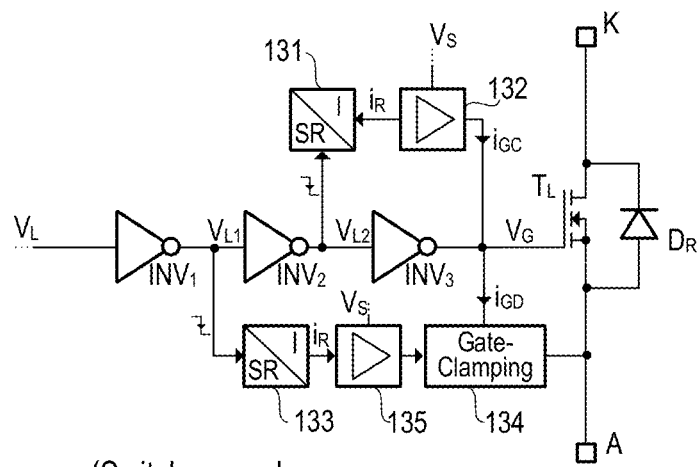
Fig. 10 (Switch-on and Switch-off)
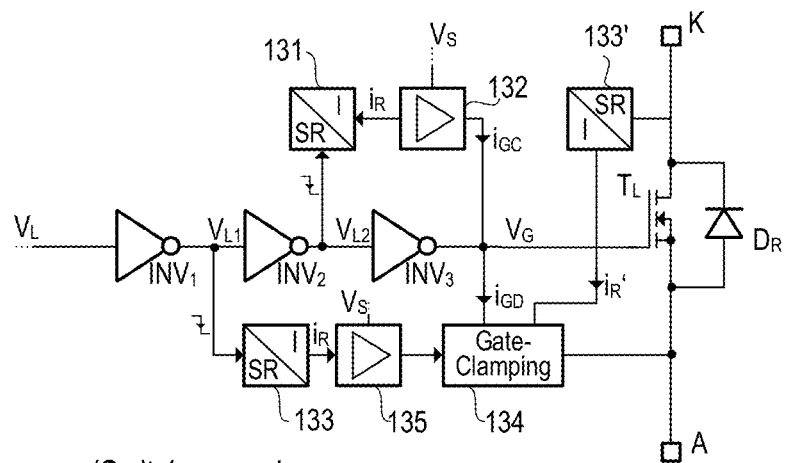
Fig. 11 (Switch-on and Switch-off)

DIODE CIRCUIT

This application claims the benefit of German Patent Application No. 102019104691.2, filed on Feb. 25, 2019, which application is hereby incorporated herein by reference.

TECHNICAL FIELD

The present description relates to the field of semiconductor switches, in particular to a transistor device that behaves in a manner similar to a diode.

BACKGROUND

Silicon diodes are used in a multiplicity of different switching converter topologies (e.g., buck converter, boost converter, etc.), in rectifier circuits and in all applications in which a current value is intended to be regulated. Since diodes in the conducting state have a significant voltage drop (forward voltage), however, a significant power loss is associated with the use of diodes. For this reason, for example in switching converters, diodes can be replaced by controlled semiconductor switches (e.g., MOS transistors), which are operated as so called synchronous rectifiers. Since MOS transistors in the on state cause a significantly lower voltage drop, the power loss can be significantly reduced in comparison with a customary silicon diode.

The driving of a MOS transistor for the purpose of synchronous rectification may require a comparatively complex circuit. Furthermore, the timing of the switching instants is critical in order to avoid (for example in the case of transistor half bridges) temporary short circuits. Integrated devices have been developed which, like diodes, comprise only two terminals (anode and cathode) and have a characteristic curve very similar to the characteristic curve of a diode, but have a lower forward voltage. Integrated devices of this type can be incorporated into a housing that is compatible with conventional types of diode housing, with the result that the user can replace diodes in existing circuits, without having to change the circuit design. Circuits of this type are sometimes referred to as "ideal diode circuits" (see e.g., P. Sachdev, "0V to 18V Ideal Diode Controller Saves Watts and Space over Schottky", in: Linear Technology Magazine, p. 24-31, September 2008).

The publication U.S. Pat. No. 10,033,297 (A. Pidutti, D. Gadler, I. Pachnis) describes a device which can replace diodes in rectifier bridges but has a forward voltage of less than 100 mV. However the maximum switching speed of such devices is too slow for many applications, for example for use in switching converters.

SUMMARY

An integrated circuit is described below. In accordance with one exemplary embodiment, the integrated circuit has a first terminal and a second terminal and comprises a MOS transistor having a control electrode and a load current path, which is configured to activate and to deactivate a load current path between the first terminal and the second terminal. A diode is arranged in parallel with the load current path of the MOS transistor. The integrated circuit further comprises a detector circuit configured to generate a control signal depending on a voltage between the first terminal and the second terminal. The integrated circuit further comprises a driver circuit having a main branch and a first feedforward branch. The main branch comprises circuit components configured to generate a control voltage for the control electrode of the MOS transistor in accordance with the control signal, and the feedforward branch comprises circuit components configured to generate a charging current or, alternatively, a discharging current as a reaction to a slope of the control signal, said current charging or discharging, respectively, the control electrode of the MOS transistor.

In accordance with a further exemplary embodiment, the integrated circuit has a first terminal and a second terminal, a MOS transistor having a control electrode and a load current path, which is configured to activate and to deactivate a load current path between the first terminal and the second terminal, a diode arranged in parallel with the load current path of the MOS transistor, and a detector circuit configured to generate a control signal depending on a voltage between the first terminal and the second terminal. The integrated circuit further comprises a driver circuit having a main branch and a further branch, wherein the main branch receives the control signal and comprises circuit components configured to generate a control voltage for the control electrode of the MOS transistor in accordance with the control signal, and wherein the further branch comprises circuit components configured to generate a discharging current as a reaction to a slope of the voltage at the second terminal, said discharging current discharging the control electrode of the MOS transistor.

BRIEF DESCRIPTION OF THE DRAWINGS

Exemplary embodiments are explained in greater detail below with reference to figures. The illustrations are not necessarily true to scale and the exemplary embodiments are not just restricted to the aspects illustrated. Rather, importance is attached to illustrating the principles underlying the exemplary embodiments. In the figures:

FIG. 6 illustrates a first example of a driver circuit contained in the integrated device for switching on a power transistor, only those components necessary for switching on the transistor being illustrated.

FIG. 7 illustrates a second example of a driver circuit contained in the integrated device for switching off a power transistor, only those components necessary for switching off the transistor being illustrated.

FIGS. 8 and 9 illustrate an alternative example to the implementation in accordance with FIG. 7.

FIGS. 10 and 11 illustrate further examples of a driver circuit contained in the integrated device for switching a power transistor on and off, wherein FIG. 10 substantially illustrates a combination of the examples from FIGS. 6 and 7 and FIG. 11 illustrates a combination of the examples from FIGS. 6, 7 and 9.

DETAILED DESCRIPTION OF ILLUSTRATIVE EMBODIMENTS

A description is given below of the applications of diodes and the integrated devices described later, which are intended to replace diodes, in the context of switching converter applications. However, this should be understood merely as one exemplary application, and it goes without saying that the integrated devices described here can also be used in other applications.

Figure 1A:
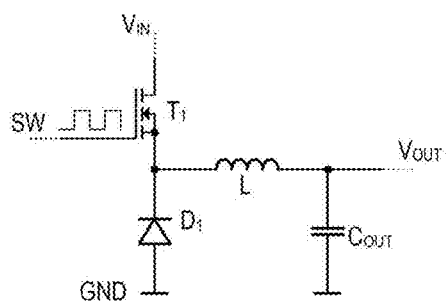
FIGS. 1A and 1B illustrate the basic structures of a buck converter and of a boost converter, wherein a half bridge having a transistor and a silicon diode is used in each case.
Figure 1B:
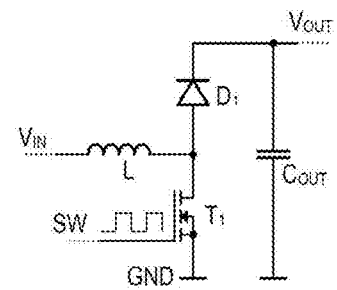

FIGS. 1A and 1B illustrate the basic structure of a buck converter (FIG. 1A) and of a boost converter (FIG. 1B). Accordingly, the buck converter comprises a half bridge comprising a (high side) semiconductor switch $T_1$ and a (low side) freewheeling diode $D_1$. That is to say that the semiconductor switch $T_1$ is connected between an input node, at which an input voltage $V_{IN}$ is present during operation, and a middle tap of the half bridge; the freewheeling diode $D_1$ is connected between the middle tap of the half bridge and a ground node, at which a reference potential is present. A coil L is connected between the middle tap of the half bridge and an output node, at which the output voltage $V_{OUT}$ is provided. A capacitor $C_{OUT}$ is connected between the output node and the ground node GND. The semiconductor switch $T_1$ can be driven with a modulated control signal SW. In many applications, the pulse width of the control signal is modulated (pulse width modulation, PWM) or the pulse repetition frequency is modulated (pulse frequency modulation, PFM). The output voltage $V_{OUT}$ is dependent on the input voltage $V_{IN}$ and the duty cycle of the control signal SW.

The boost converter in accordance with FIG. 1B, comprises a half bridge comprising a (high side) freewheeling diode $D_1$ and a (low side) semiconductor switch $T_1$. That is to say that the freewheeling diode $D_1$ is connected between an output node, at which an output voltage $V_{OUT}$ is provided, and a middle tap of the half bridge; the semiconductor switch $T_1$ is connected between the middle tap of the half bridge and a ground node GND, at which a reference potential is present. A coil L is connected between the middle tap of the half bridge and an input node, at which an input voltage $V_{IN}$ is present during operation. A capacitor $C_{OUT}$ is connected between the output node and the ground node. In the same way as in the case of the buck converter, the semiconductor switch $T_1$ can be driven with a modulated control signal SW. The output voltage $V_{OUT}$ is once again dependent on the input voltage $V_{IN}$ and the duty cycle of the control signal SW.

Figure 2A:
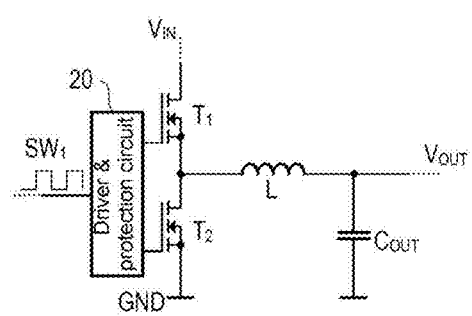
FIGS. 2A and 2B illustrate the basic structures of a buck converter and of a boost converter, wherein—compared with the example from FIGS. 1A and 1B—a second transistor is used instead of the silicon diode.
Figure 2B:
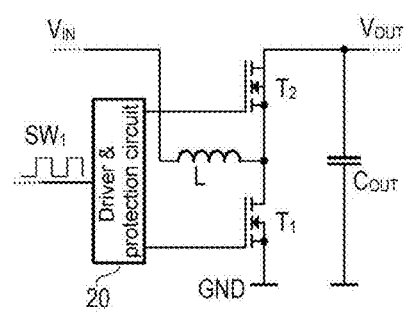

In order to increase the efficiency of the circuits from FIGS. 1A and 1B, the freewheeling diode $D_1$ can be replaced in each case by a second semiconductor switch $T_2$, which in the on state causes a significantly lower voltage drop than a silicon diode. The resulting circuits are illustrated in FIGS. 2A and 2B. Essentially, the second semiconductor switch $T_2$, which replaces the freewheeling diode $D_1$, is driven inversely with respect to the semiconductor switch $T_1$. That is to say that the semiconductor switch $T_2$ is off when the semiconductor switch $T_1$ is switched on, and vice versa. In practical implementations, however, a comparatively complex driver and protection circuit 20 is necessary in order to drive the control inputs of the semiconductor switches $T_1$ and $T_2$. In particular, it is necessary to ensure that before one semiconductor switch is switched on, the respective other semiconductor is switched off, in order to avoid a bridge short circuit (Shoot Through). For this reason, the driver and protection circuit 20 generally includes a Shoot-Through Protection circuit configured to ensure specific delay times between a switch off process and the subsequent switch on process of the respective other switch. Apart from the configuration of the half bridge and the driver and protection circuit 20, the examples from FIGS. 2A and 2B are the same as in FIGS. 1A and 1B.

Figure 3A:
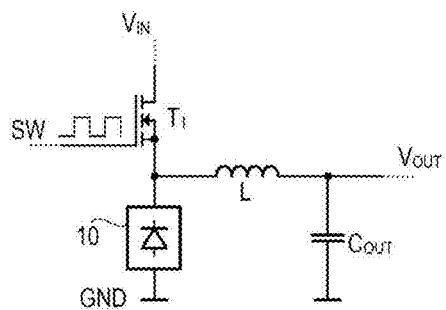
FIGS. 3A and 3B illustrate the basic structures of a buck converter and of a boost converter, wherein—compared with the example from FIGS. 1A and 1B—the silicon diode was replaced by an integrated device having two terminals, which behaves substantially like a silicon diode but has a significantly lower forward voltage than a silicon diode.
Figure 3B:
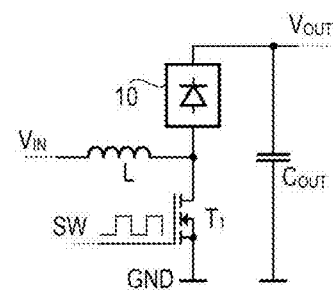

The examples in FIGS. 3A and 3B are substantially identical to the examples in FIGS. 1A and 1B, but in the buck converter and in the boost converter, the freewheeling diodes $D_1$ have been replaced in each case by an integrated circuit 10. In a manner similar to a diode, the integrated circuit 10 comprises two terminals (anode and cathode) and has a current voltage characteristic curve similar to the current voltage characteristic curve of a diode. In contrast to a silicon diode, however, the integrated circuit 10 has a significantly lower forward voltage. In a half bridge application, the integrated circuit 10 affords the same advantage as the second semiconductor switch from FIG. 2B, but without requiring the complex driver and protection circuit 20 mentioned with reference to FIG. 2B. That is to say that the integrated circuit 10 is a component having (exactly) two terminals (two terminal device), which can replace a silicon diode without the need to adapt the other components of the circuit. As already mentioned, circuits of this type are sometimes also referred to as "ideal" diode circuits. In the application shown in FIG. 3B, the use of the integrated circuit 10 instead of a simple n channel high side transistor has the advantage that the generally complicated driving of the high side transistor by means of level shifters and/or charge pumps is no longer necessary.

Figure 4:
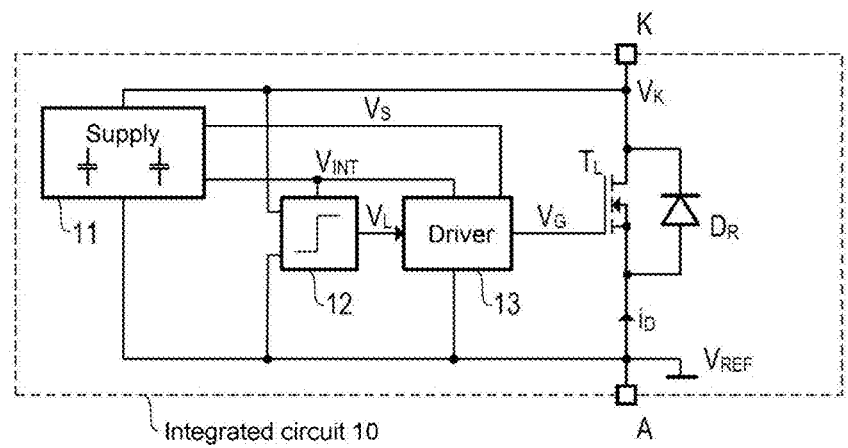
FIG. 4 illustrates the structure of the integrated device from FIGS. 3A and 3B on the basis of an exemplary block diagram.

FIG. 4 illustrates one exemplary implementation (i.e., the internal structure) of the integrated circuit 10 from FIG. 3A. In FIG. 4, the two terminals are designated by A (anode terminal) and K (cathode terminal). The load current path from the anode terminal A to the cathode terminal K includes the source drain path of a MOS transistor $T_L$, wherein the MOS transistor has an intrinsic body diode $D_R$ connected in parallel with the source drain path of the MOS transistor $T_L$. If the control electrode (gate electrode) of the transistor $T_L$ were not driven, the body diode $D_R$ would behave the same as the silicon diode $D_1$ in the examples from FIGS. 1A and 1B. In order to reduce the voltage drop between anode A and cathode K, the transistor $T_L$ is switched on if the cathode voltage $V_K$ becomes less than the anode voltage $V_{REF}$. At the latest when the condition $V_K < V_{REF}$ is no longer met, the transistor $T_L$ must be switched off in order that the integrated circuit 10 can block the current flow. In the example illustrated, the gate electrode of the transistor $T_L$ is driven by means of a driver circuit 13. The driver circuit 13 is configured to drive the MOS transistor $T_L$ in the conducting or blocking state in accordance with the level of a control signal $V_L$, in order to activate (MOS channel conducting) and to deactivate (MOS channel non-conducting) the load current path (source drain current path in the case of a MOS transistor) in parallel with the diode $D_R$. The control signal $V_L$ is generated by a detector circuit 12 on the basis of the voltages $V_K$ and $V_{REF}$ (in particular depending on the difference $V_K - V_{REF}$, wherein $V_{REF}$ can be regarded as an internal reference potential for the integrated circuit 10).

A supply voltage $V_{INT}$ is necessary for the operation of the detector circuit 12 and the driver circuit 13. Since the integrated circuit 10 comprises only the two terminals A and K, a separate supply terminal does not exist, and the supply voltage $V_{INT}$ has to be generated internally. This function is provided by the supply circuit 11. The supply circuit 11 is connected to an internal reference potential node (reference potential $V_{REF}$), which must not be confused with the ground node GND in FIGS. 3A and 3B. The internal reference potential node is connected to the anode terminal A. That is to say that for the internal voltage supply of the integrated circuit 10, the reference voltage $V_{REF}$ can be defined as 0 volts (internal ground). All voltage levels within the integrated circuit 10 refer to this internal ground (i.e., the anode potential). The supply circuit 11 can comprise one or a plurality of capacitors which are charged in those time intervals in which the cathode voltage $V_K$ (in relation to the internal ground) is greater than zero (and hence the diode $D_R$ is in the blocking state and the transistor $T_L$ is off). In the exemplary embodiments described here, the supply circuit 11 generates two internal supply voltages $V_{INT}$ and $V_S$, which are buffered by means of one or a plurality of capacitors. The first supply voltage $V_{INT}$ serves for supplying most of the circuit components and can be e.g., 5V. The use of the second supply voltage $V_S$ will be explained in even greater detail later. The supply voltage $V_S$ can correspond approximately to the voltage present at the half bridge (see FIGS. 3A and 3B) and thus also approximately to the maximum cathode voltage $V_K$,max, i.e. $V_S \approx V_K$,max$\approx V_{IN}$ in the case of the buck converter (see FIG. 3A) or $V_S \approx V_K$, max$\approx V_{OUT}$ in the case of the boost converter (see FIG. 3B). This is not necessarily the case, however; depending on the implementation, voltages lower than $V_K$,max can also be generated.

Figure 5:
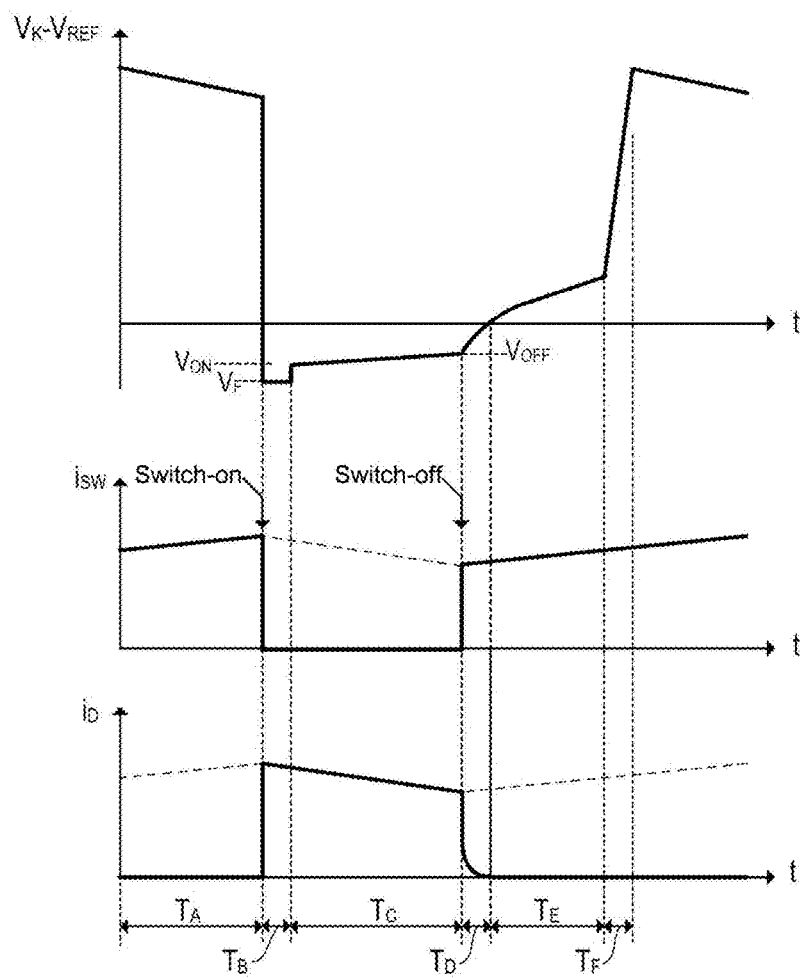
FIG. 5 is an exemplary timing diagram for illustrating the function of the integrated device from FIG. 4 in a buck converter application as illustrated e.g., in FIGS. 3A and 3B.

FIG. 5 includes several timing diagrams for illustrating the function of the example from FIG. 4. The top diagram in FIG. 5 shows an exemplary profile of the cathode voltage $V_K$ (relative to the internal ground), the bottom diagram in FIG. 5 shows the current $i_D$ through the integrated circuit 10 (from the terminal A to the terminal K), and the middle diagram in FIG. 5 shows the current $i_{SW}$ through the semiconductor switch $T_1$ in the other branch of the half bridge (see FIGS. 3A and 3B). The superposition of the two currents $i_{SW}$ and $i_D$ yields the coil current $i_L$ through the coil L of the buck converter or the boost converter.

During the time period $T_A$, the semiconductor switch $T_1$ is on and the integrated semiconductor device 10 is in a blocking state. The current $i_{SW}$ through the semiconductor switch $T_1$ (see FIGS. 3A and 3B) rises and the cathode voltage $V_K$ falls accordingly. The gradient $di_{SW}/dt$ of the current rise is dependent on the inductance of the coil L and the input voltage $V_{IN}$. In the case of the boost converter from FIG. 3B, it holds true that $di_{SW}/dt \approx V_{IN}/L$. In said time period $T_A$, the cathode voltage $V_K$ is positive and the capacitors contained in the supply circuit 11 (see FIG. 4) can be charged. The time period $T_A$ ends with the semiconductor switch $T_1$ being turned off, which results in a steep fall in the cathode voltage $V_K$ toward negative values (caused by the voltage induced in the inductance L). At the same time, the current is accepted by the intrinsic diode $D_R$ of the MOS transistor $T_L$ in the integrated circuit 10 (see FIG. 4). As soon as the condition $V_K < V_{ON}$ (where $V_{ON} \le 0$ volts) is met, the switching on of the internal MOS transistor $T_L$ of the internal semiconductor circuit is triggered, the voltage $V_K$ falling further down to a voltage $V_F \approx -0.7V$ which corresponds to the forward voltage of the intrinsic diode $D_R$. A bridge short circuit cannot occur since the MOS transistor $T_L$ only switches on when the cathode voltage $V_K$ is negative and the semiconductor switch $T_1$ in the other half bridge branch is thus reliably off. After the switch on time $T_B$, the MOS transistor $T_L$ is fully switched on and the voltage $V_K$ is less negative than $V_F$ since the current $i_D$ no longer flows through the diode $D_R$ but rather through the conducting MOS channel of the transistor $T_L$. In the subsequent time interval $T_C$, the transistor $T_L$ of the integrated circuit 10 is fully switched on, the current $i_{SW}$ in the other half bridge branch is zero, and the current $i_D$ decreases depending on the inductance of the coil L and the voltage present at the latter.

The time interval $T_C$ ends with the switching on of the semiconductor switch $T_1$ in the other half bridge branch, which has the effect that the current $i_D$ falls to zero and is accepted by the semiconductor switch $T_1$ in the other half bridge branch (see FIGS. 3A and 3B); the cathode voltage $V_K$ rises again in the subsequent time interval TD. This rise in the cathode voltage $V_K$ is detected, for example by the detection of the condition $V_K > V_{OFF}$ (where $V_{OFF} \le 0$ volts). That is to say that at the latest when the cathode voltage becomes positive, the MOS transistor $T_L$ in the integrated circuit 10 must be turned off again. At the instant at which $V_K = 0$ holds true, the current through the integrated circuit 10 is zero. In the subsequent time interval $T_E$, the charge carriers have to be depleted from the intrinsic diode $D_R$ and the voltage $V_K$ rises further. As soon as the charge carriers have been depleted from the diode $D_R$ (at the beginning of the time period $T_F$), during the time period $T_F$ the cathode voltage $V_K$ rises steeply up to its maximum value $V_K$,max and the cycle can begin anew. During the time period $T_F$, the gate voltage $V_G$ of the MOS transistor $T_L$ has to be fixedly clamped to the source potential (internal ground) in order to keep the transistor $T_L$ switched off. This function has to be ensured by the driver circuit 13. It may make sense to define the threshold voltage $V_{OFF}$ for switching off the MOS transistor $T_L$ to be slightly below zero volts in order to accelerate the depletion of the diode $D_R$.

Particularly in applications with high switching frequencies, the driver circuit 13 (see FIG. 4) has to react quickly and rapidly switch on the MOS transistor and also switch it off again. The subsequent figures, FIGS. 6-9, illustrate several examples of possible implementations of the driver circuit 13 that makes possible the rapid switching on and off mentioned.

FIG. 6 illustrates one example of an implementation of the driver circuit 13 from FIG. 4. The input voltage $V_L$ fed to the driver circuit 13 can be generated by the detector circuit 12. The voltage $V_L$ indicates whether the MOS transistor $T_L$ is intended to be switched on or off. In order to obtain the behavior of a diode (but to attain it with a low forward voltage), the MOS transistor $T_L$ is intended to be switched on if the intrinsic diode $D_R$ is forward biased. This is the case when the cathode voltage $V_K$ is negative. As already mentioned, the anode voltage $V_{REF}$ and thus the potential at the anode terminal A is defined as internal ground potential and thus zero volts ($V_{REF}=0V$). As already explained, the detector circuit 12 is configured to detect when the cathode voltage $V_K$ has become negative and when the cathode voltage $V_K$ becomes positive again. The threshold values $V_{ON}$ and $V_{OFF}$ used for the detection can be zero or slightly negative (see FIG. 5). That is to say that the voltage $V_L$ assumes a low level when the cathode voltage $V_K$ falls below the threshold value $V_{ON}$, and a high level when the threshold value $V_{OFF}$ is exceeded again. It should be emphasized here once again that the cause of the changes in the cathode voltage $V_K$ reside outside the integrated circuit 10; in the case of a switching converter application (see FIGS. 3A and 3B), the changes in the cathode voltage $V_K$ are caused by the switching of the semiconductor switch in the other half bridge branch. A low level of the voltage $V_L$ thus indicates to the driver circuit 13 to switch on the MOS transistor $T_L$ (because $V_K$ has become negative); equally, a high level of the voltage $V_L$ indicates to the driver circuit 13 to switch the MOS transistor $T_L$ off again.

The driver circuit 13 is thus configured to generate a gate voltage $V_G$ in accordance with the input voltage $V_L$, which gate voltage switches the MOS transistor $T_L$ on or off. If consideration is given to the logic states of the input voltage signal $V_L$ and of the gate voltage signal $V_G$, then the gate voltage $V_G$ has the inverted level of the input voltage $V_L$ (if $V_L$ indicates a negative cathode voltage $V_K$, then the MOS transistor $T_L$ must be switched on). In the examples described here, this inversion is achieved by means of the series connection of the three inverters $INV_1$, $INV_2$ and $INV_3$ (inverter chain), wherein the input voltage $V_L$ is fed to the first inverter $INV_1$ and the gate voltage $V_G$ is present at the output of the third inverter $INV_3$. The inverters form the main branch of the driver circuit. However, the gate voltage $V_G$ can be raised (upon switch on) or reduced (upon switch off) to the necessary level only if a sufficient charge is fed to the gate electrode (upon switch on) or is conducted away from the gate electrode of the MOS transistor $T_L$ (upon switch off) in a comparatively short time. In other words, in order to be able to alter the level of the gate voltage $V_G$ quickly, a correspondingly high gate current $i_G$ must be able to flow. The integral of the gate current $i_G$ over the switching time corresponds to the gate charge fed in/carried away.

Even though this is not illustrated explicitly in FIG. 6, the inverters $INV_1$, $INV_2$ and $INV_3$ in the main branch operate with the internal supply voltage $V_{INT}$ (see FIG. 4) of 5 volts or 3 volts, for example. Said supply voltage is provided by a capacitor contained in the supply circuit 11 (see FIG. 4), the capacitance of which capacitor (and hence the charge stored therein) is relatively limited since the supply circuit 11 together with the detector circuit 12, the driver circuit 13 and the MOS transistor $T_L$ have to be integrated in a single integrated circuit 10 having only two terminals. The supply circuit 11 is not able to make available the internal supply voltage $V_{INT}$ with a sufficient amount of current (and thus charge) to charge or to discharge the gate of the MOS transistor rapidly enough. In order to solve this problem, in the exemplary embodiments described here, the driver circuit 13 comprises, in addition to the main branch, a Feed Forward branch, which makes available the required current for charging the gate electrode of the MOS transistor $T_L$. In the example from FIG. 6, the Feed Forward branch includes the components 131 and 132, which are required only for switching on the MOS transistor $T_L$. A further Feed Forward branch can be provided for switching off the MOS transistor $T_L$; various examples of this are illustrated in FIGS. 7-9.

The component 131 shown in FIG. 6 is referred to as a slope-to-current converter and it is configured to convert a falling slope in the output signal $V_{L2}$ of the second inverter $INV_2$ into a current signal $i_R$. The current signal $i_R$ substantially comprises a current pulse, having a pulse duration which, in a simple case, can correspond to the fall time of the falling slope. The component 132 is a type of current amplifier having an output stage, which, however, is not supplied by the internal supply voltage $V_{INT}$, but rather by the additional, higher supply voltage $V_S$. The output current $i_{GC}$ of the current amplifier 132 (amplified current pulse $i_R$) is fed into the gate electrode of the MOS transistor $T_L$ and, during a falling slope in the input voltage $V_L$ (corresponds to a falling slope at the output of the inverter $INV_2$), can contribute to charging the gate of the MOS transistor $T_L$ and thus rapidly switching on the MOS transistor $T_L$. The output current $i_{GC}$ is likewise pulsed and corresponds to a quantity of charge $Q_{GC}$ that is fed to the gate of the MOS transistor (in addition to the output current of the inverter chain).

In a manner similar to the internal supply voltage $V_{INT}$, the additional supply voltage $V_S$ is provided by a capacitance contained in the supply circuit 11. However, since this capacitance is charged to the higher supply voltage $V_S$, the charge stored in the capacitance (capacitance times voltage) is significantly higher. The "decoupling" of the supply voltages $V_{INT}$ and $V_S$ is necessary since the detector circuit 12 (see FIGS. 3A and 3B) requires a stable supply voltage. However, some components of the driver circuit 13 can operate with a greatly fluctuating supply voltage $V_S$, which can decrease for example from 10V to the threshold voltage of the MOS transistor $T_L$. A stabilization of the higher supply voltage $V_S$ is therefore not necessary.

As mentioned, the example from FIG. 6 illustrates that part of the driver circuit 13 which is responsible for switching on the MOS transistor $T_L$, including the feedforward branch, which supports the charging of the gate of the MOS transistor $T_L$. The example from FIG. 7 illustrates the driver circuit 13 with a further feedforward branch, which supports the discharging of the gate of the MOS transistor $T_L$ in order to switch off the MOS transistor $T_L$. In this example, the further feedforward branch comprises the components 133, 134 and 135 and can be combined with the feedforward branch from FIG. 6.

The component 133 is likewise a slope-to-current converter, the input of which is coupled to the output of the first inverter (output signal $V_{L1}$). That is to say that the slope-to-current converter 133 sees a falling slope if the input signal $V_L$ has a rising slope, that is to say that the MOS transistor $T_L$ is intended to be switched off. As in the previous example of the slope-to-current converter 132, the slope-to-current converter 133 in FIG. 7 is also configured to convert a falling slope into an output current $i_R$, which is amplified in the same way as in the previous example. This amplification is realized by the component 135, which is likewise a type of current amplifier and which can be constructed identically to the current amplifier 132 in FIG. 6. The output current of the current amplifier 135 is fed to a clamping circuit 134 configured, depending on the amplified current $i_R$, to short circuit the gate source capacitance of the MOS transistor ML and thus quickly to discharge the gate and to switch off the MOS transistor $T_L$. The clamping circuit 134 can comprise a transistor, for example, which is coupled to the MOS transistor $T_L$ such that the gate source capacitance thereof is short circuited when the transistor contained in the clamping circuit 134 is switched on. The short circuiting of the gate source capacitance of the MOS transistor $T_L$ proceeds all the more rapidly, the faster the transistor contained in the clamping circuit 134 can be put into a conducting state as a reaction to the current $i_R$ of the slope-to-current converter 133. An amplification of the current $i_R$ by the current amplifier 135 can be expedient for this reason.

However, this current amplification by the current amplifier 135 is not absolutely necessary. The example from FIG. 8 is a modification of the previous example from FIG. 7 in which the current amplifier 135 has been omitted. In this case, the output of the slope-to-current converter 133 is connected to the input of the clamping circuit 134 without an intervening amplifier. That is to say that the slope-to-current converter 133 is connected between the output of the second inverter $INV_2$ and the input of the clamping circuit 134. In this case, the activation of the transistor contained in the clamping circuit 134 for the purpose of short circuiting the gate source capacitance of the MOS transistor $T_L$ can have a somewhat longer duration than in the previous example. The fact of whether a more rapid discharge of the gate electrode of the MOS transistor $T_L$ is necessary, or whether a somewhat slower discharge (without a current amplifier 135) is sufficient, depends on the specific application.

The example from FIG. 9 is a special modification of the previous example from FIG. 8, wherein in particular the slope-to-current converter 133' receives as input signal the cathode voltage $V_{\neg K}$ rather than the output signal $V_{L1}$ of the inverter $INV_1$. Like the slope-to-current converter 133 in FIG. 8, the slope-to-current converter 133' reacts to a rising slope of the cathode voltage $V_K$, which substantially corresponds to the drain source voltage at the MOS transistor $T_L$. As in the previous example, the resulting output current $i_R$ of the slope-to-current converter 133' is fed to the clamping circuit 134. Since the slope of the cathode voltage $V_K$ is significantly higher than the slope at the output of the inverter $INV_1$, the resulting current $i_R$ flows during the entire time of the voltage rise. It can also be higher than in the previous example in order reliably to switch off the MOS transistor $T_L$. In contrast to the example from FIG. 7, in the example in accordance with FIG. 9, the higher supply voltage $V_S$ is not loaded with current during turn-off, with the result that the dimensioning of the associated capacitor in the supply circuit 11 (cf. FIGS. 3A and 3B) can be made smaller.

As mentioned, the circuits for switch on (e.g., FIG. 6) and switch off (FIGS. 7-9) can be combined with one another, such that the driver circuit 13 comprises two feedforward branches. FIG. 10 illustrates a driver circuit that constitutes a combination of the examples from FIGS. 6 and 7. The current amplifiers 132 and 135, which operate with the additional, higher supply voltage $V_S$, allow comparatively rapid switching on and off of the MOS transistor $T_L$ and thus the use of the integrated circuit 10 in comparatively fast switching applications such as e.g., switching converters. In a further exemplary embodiment, the circuits in accordance with FIGS. 6, 7 and 9 are combined. This situation is illustrated in FIG. 11.

Figures 12A, 12B:
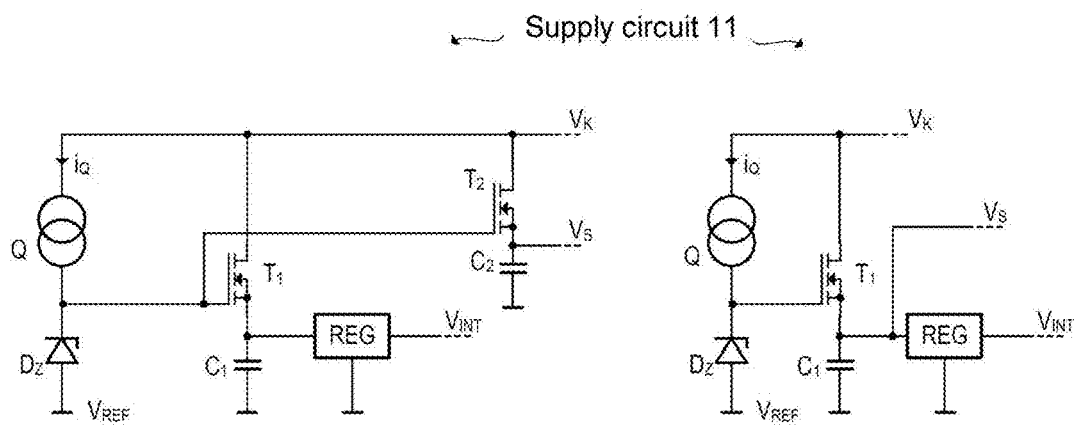
FIGS. 12A and 12B illustrate one exemplary implementation of a supply circuit that can be used in the example from FIG. 4.

FIG. 12A illustrates one example of a possible implementation of the supply circuit 11 that can be used in the example from FIG. 4. As mentioned, the supply circuit 11 is configured to generate both a regulated supply voltage $V_{INT}$ and an unregulated supply voltage $V_S$. The unregulated supply voltage $V_S$ can be higher than the regulated supply voltage $V_{INT}$. The supply circuit 11 is connected between the anode terminal A (anode voltage/reference potential $V_{REF}$) and the cathode terminal (cathode voltage $V_K$). As mentioned, the reference potential $V_{REF}$ can be assumed to be 0V, whereas the cathode voltage $V_K$—relative to the reference potential $V_{REF}$—fluctuates greatly. The supply voltages $V_{INT}$ and $V_S$ thus have to be generated from the cathode voltage $V_K$ and be buffered by means of capacitors.

In the example from FIG. 12A, the capacitors $C_1$ and $C_2$ are charged via the transistors $T_1$ and $T_2$, respectively. The transistor $T_1$ is connected between a first terminal of the capacitor $C_1$ and the cathode terminal K (cathode voltage $V_K$). Equally, the transistor $T_2$ is connected between a first terminal of the capacitor $C_2$ and the cathode terminal K. The second terminals of the capacitors $C_1$ and $C_2$ are at reference potential $V_{REF}$. The voltage across the capacitor $C_2$ is the unregulated supply voltage $V_S$. The voltage across the capacitor $C_1$ is fed to the input of a voltage regulator REG, which provides the regulated supply voltage $V_{INT}$ at its output.

The control terminals of the transistors $T_1$ and $T_2$, respectively, are driven such that the transistors are in the on state when the cathode voltage is high (i.e., above a certain threshold value) and are in the off state when the cathode voltage is low (i.e., below a certain threshold value). In the example illustrated, the transistors $T_1$ and $T_2$, respectively, are MOS transistors, the gate electrodes of which are charged via a current source Q provided that the cathode voltage $V_K$ is high enough to drive the current $i_Q$ of the current source Q. A Zener diode $D_Z$ connected between the gate electrodes and the reference potential $V_{REF}$ limits the gate voltage to the Zener voltage of the Zener diode $D_Z$. The maximum voltage across the capacitors $C_1$ and $C_2$ is thus also limited to a value that is approximately equal to the Zener voltage minus the threshold voltage of the respective transistor $T_1$ and $T_2$.

FIG. 12B illustrates a modification of the example from FIG. 12A in which the capacitor $C_1$ buffers the unregulated supply voltage $V_S$ and the regulated supply voltage $V_{INT}$ is derived from the unregulated supply voltage $V_S$. In this case, only one capacitance is necessary (which, however, can be constructed from a plurality of individual capacitors). It goes without saying that the examples from FIGS. 12A and 12B merely represent simple implementations and actual implementations may be more complex and are also dependent on the technology used. In particular, a plurality of capacitors can be connected in parallel in order to achieve the desired capacitance. The Zener diode $D_Z$ can also be replaced by other circuit components that bring about voltage limiting. In the simplest case, the current source Q is realized by a resistor or a transistor. Depending on the implementation, it may be necessary to connect a respective diode in series with the load current path of the transistors $T_1$ and $T_2$ in order to prevent an undesired discharge of the buffer capacitors. In this case—with transistors switched off—the diodes would be connected in antiseries with the intrinsic body diodes (not illustrated in FIGS. 12A and 12B) of the transistors $T_1$ and $T_2$.

Figure 13:
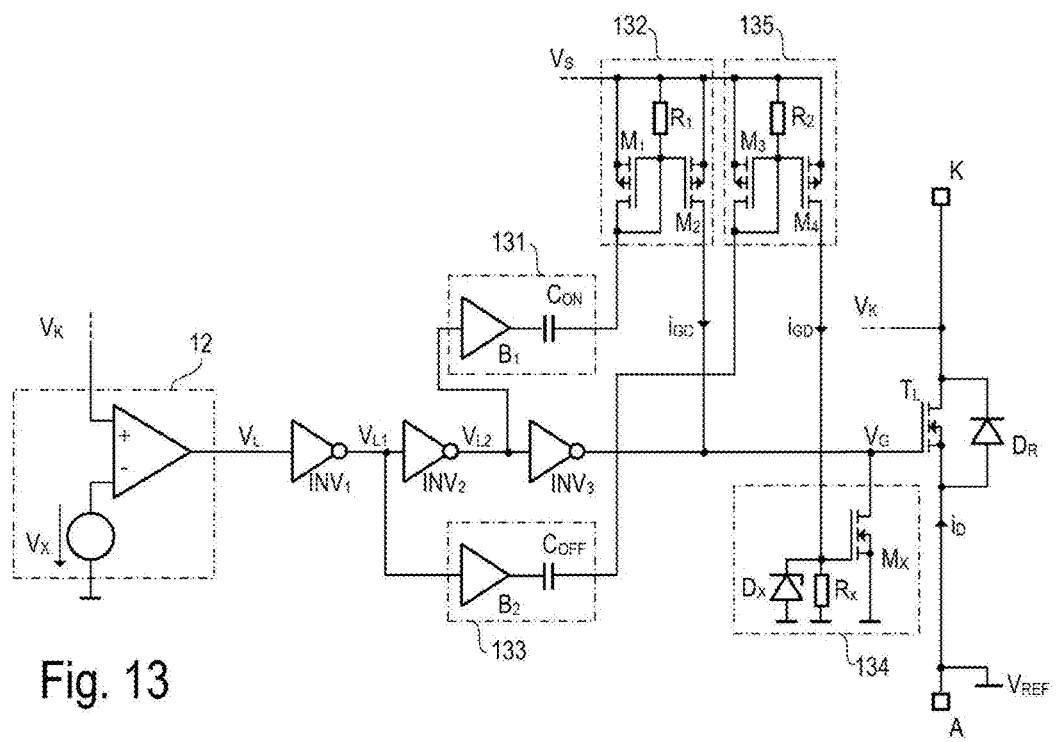
FIGS. 13 and 14 show exemplary implementations of the circuits in accordance with FIGS. 10 and 11.

FIG. 13 illustrates one exemplary implementation of the example from FIG. 11 in greater detail. In the example illustrated, the detector circuit 12 comprises a comparator K, to which the cathode voltage $V_K$ is fed at a first input and a reference voltage $V_X$ is fed at a second input. The comparator K is configured to compare the voltages $V_K$ and $V_X$ and to signal at its output whether the cathode voltage $V_K$ is greater than the reference voltage $V_X$. If that is the case, the output voltage $V_L$ of the comparator K (and thus also the output voltage of the detector circuit 12) has a high level, otherwise a low level, wherein the levels (high and low) should be understood as logic levels. The inverter chain comprising the three inverters $INV_1$, $INV_2$ and $INV_3$ inverts the output signal $V_L$ of the detector circuit 12 three times, that is to say that the output signal $V_G$ of the third inverter $INV_3$ is inverted in comparison with the output signal $V_L$ of the detector circuit 12. If the cathode voltage $V_K$ falls below the reference voltage $V_X$ ($V_X<V_K$), then the output signal $V_L$ of the detector circuit 12 is at a low level and the output signal $V_G$ (gate voltage of the transistor $T_L$) of the third inverter $INV_3$ is at a high level. In other words, the transistor $T_L$ is switched on if $V_K<V_X$ holds true. The reference voltage can also have a negative value (e.g., −50 mV).

The comparator K and the inverters $INV_1$, $INV_2$ and $INV_3$ are supplied by way of the regulated supply voltage $V_{INT}$ (not illustrated explicitly in FIG. 13). As already mentioned above, the inverter $INV_3$ cannot supply an output current that is high enough to switch the transistor $T_L$ on and off at the desired speed. As already explained with reference to FIGS. 6 and 7, with the aid of the slope-to-current converters 131 and 133 and also the associated current amplifiers 132 and 135, current is additionally drawn from the unregulated voltage supply (supply voltage $V_S$) in order to be able to switch the transistor $T_L$ on and off more rapidly. The switch off is effected by means of the clamping circuit 134, which is able to clamp the gate source voltage of the transistor to zero volts.

The slope-to-current converters 131 and 133 substantially include in each case a capacitor (see FIG. 13, capacitors $C_{ON}$ and $C_{OFF}$, respectively). A respective buffer $B_1$, $B_2$ can be connected upstream of the capacitors $C_{ON}$ and $C_{OFF}$, and can supply more current at its output than the inverters $INV_1$ and $INV_2$, that is to say that the output transistor stages of the buffers $B_1$ and $B_2$ are designed for higher currents than the output transistor stages of the inverters. Nevertheless, the buffers $B_1$ and $B_2$ can also be omitted in some exemplary embodiments and are therefore optional. One or both of the buffers $B_1$ and $B_2$ can have an inverting characteristic. In this case, the input signal of the buffers $B_1$ and $B_2$ should also be inverted. That is to say that if e.g., the buffer $B_2$ had an inverting characteristic, then the signal $V_{L2}$ (instead of $V_{L1}$) would have to be fed to it as input signal. The function of the circuit does not change as a result.

In the example from FIG. 13, during a falling slope in the signal $V_{L2}$, a current flows through the capacitor $C_{ON}$ (the current through the capacitor is proportional to the change in voltage). This current can be regarded as an input signal for the current amplifier 132, which is supplied by the unregulated voltage supply (supply voltage $V_S$). The current amplifier 132 can be implemented substantially as a current mirror comprising an input branch having a first transistor $M_1$ and an output branch having a second transistor $M_2$. The input current that flows through the transistor $M_1$ (in order to charge the capacitor $C_{ON}$) is "mirrored" with a defined gain factor into the output branch, and the amplified output current $i_{GC}$ is fed to the gate electrode of the MOSFET $T_L$ in order to charge it and to switch on the MOSFET $T_L$. The resistor $R_1$ serves to charge the capacitor $C_{ON}$ again while the MOSFET $T_L$ is switched off. It should be emphasized once again at this juncture that the output current $i_{GC}$ of the current amplifier 132 is supplied by the unregulated voltage supply.

During a falling slope in the signal $V_{L1}$ (corresponds to a rising slope in the signal $V_{L2}$), a current flows through the capacitor $C_{OFF}$ which is proportional to the change in voltage at the capacitor $C_{OFF}$. This current can be regarded as an input signal for the current amplifier 135, which, like the current amplifier 132, is supplied by the unregulated voltage supply (supply voltage $V_S$). The current amplifier 135 can be constructed identically to the current amplifier 132, and reference is made to the explanations above. In the example illustrated, the current amplifier 135 comprises a current mirror having the transistor $M_3$ in the input branch and the transistor $M_4$ in the output branch. The current through the capacitor is "mirrored" to the output branch in an amplified manner, and the output current $i_{GD}$ (supplied by the unregulated voltage supply) is fed to the clamping circuit 134, which finally switches off the MOSFET $T_L$. The resistor $R_2$ serves to discharge the capacitor $C_{OFF}$ again while the MOSFET $T_L$ is switched on.

The clamping circuit 134 is configured to clamp the gate source voltage $V_G$ of the transistor $T_L$ to approximately zero volts for the purpose of turning off the MOSFET $T_L$. In the example illustrated in FIG. 13, the clamping circuit 134 contains an electronic switch $M_X$ (e.g., a further MOS transistor $M_X$), which is switched on in order to clamp the gate voltage $V_G$ practically to zero volts. In order to switch on the electronic switch $M_X$ rapidly and reliably, the amplified current $i_{GD}$ (output current of the current amplifier 135) is fed to the control electrode of said electronic switch. In the illustrated case of a MOS transistor—as a reaction to a falling slope in the signal $V_{L1}$—the gate electrode of the MOS transistor $M_X$ is charged by the output current of the current amplifier 135, as a result of which the MOS transistor $M_X$ is switched on rapidly and reliably in order to clamp the gate of the MOSFET $T_L$ to zero volts. The diode $D_X$ is a Zener diode that limits the gate voltage of the MOS transistor $M_X$ to a specific maximum value. The resistor $R_X$ connected in parallel with the gate source capacitance of the MOS transistor $M_X$ allows the gate electrode of the transistor $M_X$ to be discharged until the next switch off process of the MOSFET $T_L$. Other, more complex embodiments of the clamping circuit 134 are likewise possible.

Figure 14:
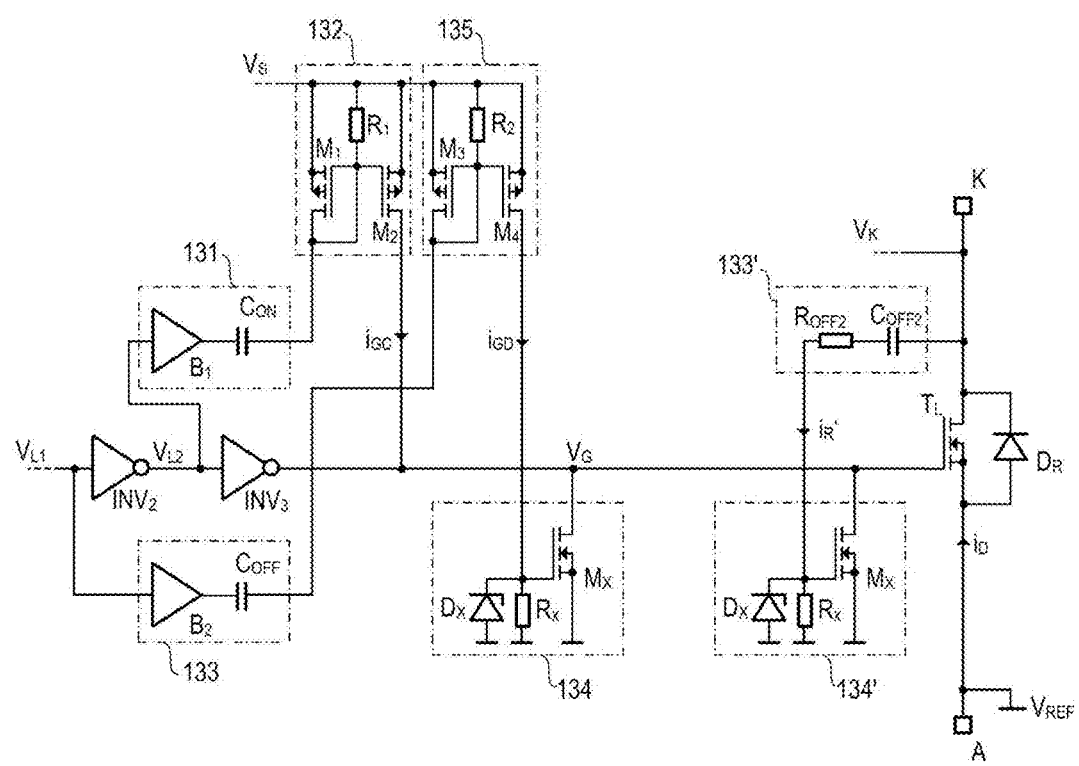

As mentioned, the exemplary embodiment from FIG. 13 substantially corresponds to the general example from FIG. 10. The exemplary embodiment from FIG. 14 is substantially the same as the previous example from FIG. 13, but with the additional slope-to-current converter 133' coupled between the cathode terminal K and a further clamping circuit 134'. The left hand part of the circuit has been omitted in FIG. 14 for reasons of space; it is the same as in FIG. 13 anyway, as mentioned.

As a reaction to a rising slope in the cathode voltage $V_K$, the slope-to-current converter 133' provides a current $i_{GD2}$, which is fed to the further clamping circuit 134'. In the example illustrated, the slope-to-current converter 133' comprises a capacitor $C_{OFF2}$ and optionally a series resistor $R_{OFF2}$. The clamping circuit 134' can be constructed substantially identically to the clamping circuit 134. As a reaction to a rising slope in the cathode voltage $V_K$, the charging current through the capacitor $C_{OFF2}$ also has the effect that the transistor $M_X$ in the clamping circuit 134' is activated and the gate voltage $V_G$ of the MOSFET $T_L$ is clamped to zero volts.

Even though the detector circuit 12 in the examples illustrated here is constructed relatively simply with only one comparator, other exemplary embodiments can comprise more complex detector circuits. The detector circuit can be configured, for example, after the detection of a negative cathode voltage ($V_K < V_{ON}$, see FIG. 5), to prevent the signaling of a positive cathode voltage ($V_K > V_{OFF}$, see FIG. 5) for a specific time duration in order to avoid undesired toggling. In applications in which the ideal diode circuit described here is used in a half bridge which is driven in accordance with a pulse width modulated signal, the abovementioned time duration for which the MOSFET $T_L$ is prevented from being switched on again can be dependent on the duty cycle and/or the frequency of the pulse width modulated signal.

What is claimed is:
1. An integrated circuit comprising:
a first terminal and a second terminal;
a MOS transistor having a control electrode and a load current path, which is configured to activate and to deactivate a load current path between the first terminal and the second terminal;
a diode arranged in parallel with the load current path of the MOS transistor;

a detector circuit configured to generate a control signal depending on a voltage between the first terminal and the second terminal; and a driver circuit having a main branch and a first feedforward branch, wherein the main branch receives the control signal and comprises circuit components configured to generate a control voltage for the control electrode of the MOS transistor in accordance with the control signal, and wherein the first feedforward branch comprises circuit components configured to generate a charging current or discharging current as a reaction to a slope of the control signal, said charging current or discharging current charging or discharging, respectively, the control electrode of the MOS transistor.

2. The integrated circuit as claimed in claim 1, wherein the main branch comprises a chain having a plurality of inverters, the control signal being fed to said chain and an output of said chain being connected to the control electrode.

3. The integrated circuit as claimed in claim 1, wherein the first feedforward branch comprises a slope-to-current converter configured to generate a current pulse as a reaction to a slope of the control signal, and wherein the first feedforward branch comprises a current amplifier configured to amplify the current pulse, and wherein an output of the current amplifier is connected to the control electrode of the MOS transistor.

4. The integrated circuit as claimed in claim 1, further comprising:

a second feedforward branch comprising circuit components configured to generate a discharging current as a reaction to a slope of the control signal or to a slope of the voltage at the second terminal, said discharging current discharging the control electrode of the MOS transistor.

5. The integrated circuit as claimed in claim 4, wherein the second feedforward branch comprises a clamping circuit, which is connected to the control electrode of the MOS transistor and is configured to activate and to deactivate a current path for discharging the control electrode.

6. The integrated circuit as claimed in claim 5, wherein the second feedforward branch comprises a slope-to-current converter configured to generate a current pulse as a reaction to a slope of the control signal, and wherein the current pulse brings about an activation of the current path by the clamping circuit.

7. The integrated circuit as claimed in claim 6, wherein the second feedforward branch comprises a current amplifier configured to amplify the current pulse.

8. The integrated circuit as claimed in claim 6, wherein the clamping circuit comprises a semiconductor switch, the current pulse being fed to a control input of said semiconductor switch.

9. The integrated circuit as claimed in claim 1, further comprising:

a supply circuit configured to generate a first supply voltage and a second supply voltage, wherein the first supply voltage stabilizes and is less than the second supply voltage, wherein the detector circuit is supplied by the first supply voltage and at least one circuit component in the first feedforward branch is supplied by the second supply voltage.

10. An integrated circuit comprising:

a first terminal and a second terminal;

a MOS transistor having a control electrode and a load current path, which is configured to activate and to deactivate a load current path between the first terminal and the second terminal;

a diode arranged in parallel with the load current path of the MOS transistor;

a detector circuit configured to generate a control signal depending on a voltage between the first terminal and the second terminal; and a driver circuit having a main branch and a further branch, wherein the main branch receives the control signal and comprises circuit components configured to generate a control voltage for the control electrode of the MOS transistor in accordance with the control signal, and wherein the further branch comprises circuit components configured to generate a discharging current as a reaction to a slope of the voltage at the second terminal, said discharging current discharging the control electrode of the MOS transistor.

* * * * *